United States Patent
Kubota (10) Patent No.: US 8,341,833 B2
(45) Date of Patent: Jan. 1, 2013

(54) METHOD FOR MANUFACTURING PRINTED WIRING BOARD

(75) Inventor: Hiroshi Kubota, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 1080 days.

(21) Appl. No.: 12/257,326

(22) Filed: Oct. 23, 2008

(65) Prior Publication Data

US 2009/0090004 A1    Apr. 9, 2009

Related U.S. Application Data

(63) Continuation of application No. PCT/JP2007/058421, filed on Apr. 18, 2007.

(30) Foreign Application Priority Data

Apr. 24, 2006  (JP) ................. 2006-119168

(51) Int. Cl.
*H05K 3/36* (2006.01)

(52) U.S. Cl. ................. 29/830; 29/825; 29/840; 29/852

(58) Field of Classification Search ............ 29/825, 29/830, 840, 852; 228/180
See application file for complete search history.

(56) References Cited

U.S. PATENT DOCUMENTS

| | | | |
|---|---|---|---|
| 5,873,161 A * | 2/1999 | Chen et al. | 29/830 |
| 6,179,196 B1 * | 1/2001 | Heim et al. | 228/6.1 |
| 6,531,022 B1 * | 3/2003 | Tsukahara | 156/256 |
| 7,793,817 B2 * | 9/2010 | Okamoto et al. | 228/102 |

FOREIGN PATENT DOCUMENTS

| | | |
|---|---|---|
| JP | 63-189909 | 8/1988 |
| JP | 5-110261 | 4/1993 |
| JP | 9-323180 | 12/1997 |
| JP | 10-186683 | 7/1998 |
| JP | 2000-223833 | 8/2000 |
| JP | 2002-223078 | 8/2002 |
| JP | 2004-272167 | 9/2004 |

OTHER PUBLICATIONS

Search Report dated Jun. 19, 2007 for International Application No. PCT/JP2007/058421.

* cited by examiner

*Primary Examiner* — Carl Arbes
(74) *Attorney, Agent, or Firm* — Beyer Law Group LLP (57) ABSTRACT

A method for manufacturing a printed circuit board having a substrate composed of an insulation material, a via hole formed in the substrate, and a via land formed around the opening of the via hole on a surface of the substrate includes processes of measuring deformation of the substrate having the via hole formed therein, calculating a position where the via land is to be patterned on the basis of the deformation of the substrate measured in the measurement process, and patterning the via land at a position corrected on the basis of the value calculated in the calculation process.

17 Claims, 10 Drawing Sheets

METHOD FOR MANUFACTURING PRINTED WIRING BOARD

CLAIM OF PRIORITY

This application is a continuation of International Application No. PCT/JP2007/058421, filed Apr. 18, 2007, which claims benefit of the Japanese Patent Application No. 2006-119168 filed on Apr. 24, 2006, both of which are hereby incorporated by reference.

BACKGROUND OF THE INVENTION

1. Field of the Invention

The present invention relates to a method for manufacturing a printed circuit board adapted to flip-chip packaging of LSI, and the like, more particularly to a method for manufacturing a printed circuit board enabling high density wiring.

2. Description of the Related Art

In the case of a known method for manufacturing a printed circuit board, a dimensional correction amount of a wiring pattern layer formed on a conductive layer is obtained on the basis of an alignment via hole, and an outer pattern layer is formed using the dimensional correction amount, as described in Japanese Unexamined Patent Application Publication No. 2000-223833 (page. 1).

There is a known pattern-forming method that includes a measurement process in which a distance between marks on a substrate is measured and stored as a measurement data, and an image data calculation process in which an image data for a new image position is calculated on the basis of the measurement data, as described in Japanese Unexamined Patent Application Publication No. 2004-272167 (page. 3).

There is also a known method for manufacturing a printed circuit board in which arbitrary pattern positions or arbitrary reference positions of an inner core substrate are measured and corrected dimensions are determined by calculating the difference between the measurement results and reference values therefor, and a via hole in an outer layer substrate composed of prepreg material is formed on the basis of the data corresponding to the correction dimensions, as described in Japanese Unexamined Patent Application Publication No. 2002-223078 (page. 2).

Moreover, there is a known method for manufacturing a printed circuit board in which position coordinates of an LSI mounted area and target marks are calculated on the basis of image data obtained by photographing the target marks, correction amounts (rotation angle and parallel displacement) needed for alignment are determined by calculating the difference between the calculated position coordinates and designed position coordinates corresponding to target marks for aligning respective LSI mounted areas and a thin layer pattern, and exposure data needed for exposing the thin layer pattern are transformed on the basis of the correction amounts, as described in Japanese Unexamined Patent Application Publication No. H10-186683 (page. 2).

Incidentally, an imaging device is known that is capable to perform an appropriate scaling correction treatment against a dimensional variance of each of objects to be imaged, and is also capable to image a pattern with high precision regardless of dimensional variances of the objects to be imaged by performing the scaling correction treatment in a unit of a pixel or less of raster data, as described in Japanese Unexamined Patent Application Publication No. H9-323180 (page. 1 and 18).

Electronic products have been required to be compact and still be multifunctional, and such requirements are expected to increase also in coming years, which brings about a demand for a high degree of integration and miniaturization of a printed wiring board. An effective way to respond to the need is to achieve a high-density wiring, in which a pitch between adjacent pattern lines is made fine.

However, since a printed wiring board is subjected to a plating treatment in the manufacturing process, it is considerably deformed as a whole due to expansion/contraction of a resin layer constituting a substrate. It is therefore necessary to form a via land provided in each of upper and lower wiring layers in advance so as to have a diameter size larger than the diameter size of a via hole provided in an insulation layer between the upper and lower wiring layers. Otherwise, bonding of the via lands and a conductive portion in the via hole may fail in the process in which wiring layers are piled up using a build-up method or the like, and thereby defective printed wiring boards may be produced.

For this reason, each of a via land formed in respective upper and lower wiring layers and a via hole formed in an insulation layer between the wiring layers has been provided with a dimensional allowance for deformation due to external forces arising from temperature hysteresis, humidity hysteresis, polishing, positioning, transferring, and other process conditions. A recent advanced printed wiring board has, for example, a via land of the diameter size 250 μm with respect to a via hole of the diameter size 75 μm.

Like this, the diameter size of a via land is need to be three times or more than that of a via hole, and because much of the space of a wiring layer has to be allocated to the via land, a pitch between adjacent pattern lines formed on the wiring layer are not to be made narrow. That is, known methods for manufacturing a printed circuit board have a problem that the increasing of wiring density is limited.

Incidentally, there is a fact that electronic parts such as IC or the like mounted on a printed wiring board are not subjected to a change in the outer dimensions or the pitch of electrodes even though the printed wiring board itself is deformed. Predetermined dimensions in the area for mounting electronic parts and the pitch of the bonding lands connected with the electrodes should be ensured regardless of deformation of the printed wiring board.

SUMMARY OF THE INVENTION

The present invention provides a method for manufacturing a printed circuit board that implements high-density wiring thereof for solving the above problems, and more specifically that ensures a predetermined mounted area and a pitch of bonding lands regardless of deformation of a substrate and enables electronic parts to be reliably bonded.

The present invention is characterized in that a method for manufacturing a printed circuit board includes processes of (a) measuring deformation of the substrate having the via hole formed therein, (b) calculating a position where the via land is to be patterned on the basis of the deformation of the substrate measured in the process (a), and (c) patterning the via land at a position corrected on the basis of the value calculated in the process (b), the printed circuit board having a substrate composed of an insulation material, a via hole formed in the substrate, and a via land formed around the opening of the via hole on a surface of the substrate.

In the above invention, deformation of the substrate is measured and the via land is formed to meet the shape of the substrate after deformed, so the via land having a proper size is able to be located in an appropriate position.

In the process (b), a position on the surface of the substrate where a wiring pattern is to be patterned may be calculated at the same time when the position where the via land is to be patterned is calculated, and in the process (c), both the via land and the wiring pattern may be each patterned at the position corrected on the basis of the value calculated in the process (b).

In the above process, it may be prevented that the dimensional size of the via land becomes large unnecessarily with respect to the dimensional size of the via hole, and it therefore becomes possible to arrange wiring in proportionately less area.

It is preferable that a plurality of measuring references may be provided on the substrate, and in the process (a), deformation of the substrate may be measured by detecting the positions of the plurality of measuring references.

In the above process, it is possible to pattern a proper via land and a wiring pattern on a substrate, even when the substrate is deformed unequally between longitudinal and transverse directions or unevenly over the surface thereof.

Following the process (c), it is preferable to includes processes of (d) overlaying a second substrate composed of an insulation material at least on one side surface of the substrate, (e) measuring deformation of a laminated body composed of the substrate and the second substrate, after the process (d), (f) calculating a position on the second substrate where a second via hole is to be formed on the basis of the deformation of the laminated body measured in the process (e), (g) forming the second via hole at a position on the second substrate, where is corrected on the basis of the value calculated in the process (f), and (h) patterning a second via land positioned around the opening of the second via hole and a second wiring pattern on a surface of the second substrate.

In the above process, even in the case of a multi-layered printed wiring board composed of a laminated body, the second via hole, the second via land and the second wiring pattern each having a proper size may be able to be formed in respective appropriate positions.

It is preferable that, in the above processes, the measurement of deformation of the substrate in the process (a) and the measurement of deformation of the laminated body in the process (e) are both performed on the basis of a common measurement reference provided in the substrate.

In the above process, it is not necessary to furnish a measurement reference for every process, but the measurement of deformation of the laminated body is able to be performed on the basis of a common measurement reference, so the density of wiring may be increased.

In the process (h), it is preferable that a position where the second via land is to be patterned is calculated on the basis of the deformation measured in the process (e), and the second via land is patterned at the position corrected on the basis of the calculated value.

In the above process, it may be prevented that the dimensional size of the second via land becomes large unnecessarily with respect to the dimensional size of the second via hole, and it therefore becomes possible to arrange wiring in proportionately less area.

In addition to the above process, the method for manufacturing a printed circuit board preferably includes a process (i) of forming a plurality of bonding lands, which are electrically connected to the second wiring pattern and to which electrodes of an electronic part are fixed, in a mounted area, where the electronic part is mounted, on the surface of the second substrate concurrently in the process (h) or in a process therebefore or thereafter.

In the above process, the dimensions of each of the bonding lands may not change as with deformation of the substrate and the bonding lands may be formed at a predetermined pitch; therefore, an electronic part and the like may be mounted in the mounted area, and also the electrodes of the electronic part and the bonding lands may be individually connected reliably.

It is also preferable that the position where the mounted area to be allocated is calculated on the basis of the deformation of the laminated body measured in the process (e), and in the step (i), the position of the mounted area is corrected on the basis of the calculated value, and yet the bonding lands are patterned so that the pitch thereof becomes to be the predetermined pitch regardless of deformation of the laminated body.

In the above process, since the bonding lands are patterned at the predetermined pitch without changing the dimensions thereof although the position of the mounted area is corrected as the substrate is deformed, an electronic part and the like may be mounted in the mounted area, and also the electrodes of the electronic part and the bonding lands may be individually electrically connected reliably.

The present invention is also characterized in that a method for manufacturing a printed circuit board includes processes of (j) measuring deformation of a laminated body composed of the first substrate and the second substrate, (k) calculating a position where the via hole is to be formed on the basis of the deformation of the laminated body measured in the process (j), and (l) forming the via hole at a position in the second substrate corrected on the basis of the value calculated in the process (k), the printed circuit board having a first substrate composed of an insulation material, a first wiring pattern formed on a surface of the first substrate, a second substrate composed of an insulation material overlaid on at least one side surface of the first substrate, a second wiring pattern formed on a surface of the second substrate, and a via hole formed in the second substrate to serve for electrical connection between the first wiring pattern and the second wiring pattern.

In the above invention, even when a laminated body composed of a first substrate and a second substrate deforms, a via hole may be formed in an appropriate position on the second substrate.

It is preferable that the above processes further include a process (m) of forming a via land positioned around the opening of the via hole on a surface of the second substrate before or after the process (l), wherein, in the process (m), a position where the via land is to be patterned is calculated on the basis of the deformation measured in the step (j), and the via land is patterned at the position corrected on the basis of the calculated value.

In the above process, it may be able to form a via land having a proper size in an appropriate position on the second substrate, and thereby the mounting density on the second substrate may be enhanced.

In addition to the above process, the method for manufacturing a printed circuit board preferably includes a process (n) of forming a plurality of bonding lands, which are electrically connected to the second wiring pattern and to which electrodes of an electronic part are fixed, in a mounted area, where the electronic part is mounted, on the surface of the second substrate concurrently in the process (l) or in a process therebefore or thereafter, and in the process (n), the bonding lands are preferably patterned with a predetermined pitch predetermined in accordance with the dimensions of electronic parts regardless of deformation of the laminated body.

In the above process, the electrodes of an electronic part may be electrically connected reliably to the bonding lands formed in a mounted area regardless of deformation of the laminated body.

In addition, the position where the mounted area to be allocated is preferably calculated on the basis of the deformation of the laminated body measured in the process (j), and in the process (n), the position of the mounted area is also preferably corrected on the basis of the calculated value, and yet the bonding lands may be patterned so that the pitch thereof becomes to be the predetermined pitch regardless of deformation of the laminated body.

In the above process, it may be able to ensure a mounted area for an electronic part on the substrate regardless of deformation of the laminated body.

The present invention is also characterized in that a method for manufacturing a printed circuit board includes processes of (o) measuring deformation of the substrate, (p) calculating a position where the mounted area is to be allocated on the basis of the deformation measured in the process (o), and (q) correcting the allocated position of the mounted area on the basis of the value calculated in the process (p), and patterning the bonding lands and the wiring pattern so that the pitch of the bonding lands becomes to be the predetermined pitch according to the dimensions of the electronic part regardless of deformation of the substrate, the printed circuit board having a single-layer or multilayer substrate provided on its surface with a mounted area for installing an electronic part, a plurality of bonding lands positioned in the mounted area for fixing electrodes of the electronic part, and a wiring pattern connected to the bonding lands.

In the above process, it may be able to ensure a mounted area for an electronic part on any one of the single-layer or multilayer substrate regardless of deformation of the substrate. Moreover, the bonding lands formed in a mounted area and the electrodes of an electronic part may be electrically connected reliably.

In the above substrate, a via hole is preferably formed in the substrate, and a via land positioned around the opening of the via hole is also preferably patterned at a position on a surface of the substrate, the position being corrected on the basis of the value calculated in the process (p).

In each of the above inventions, the patterning may include processes of forming a resist layer for covering a conductive layer on a surface of a substrate, exposing the resist layer by applying light thereon so as to draw a predetermined pattern, removing the resist layer with leaving the predetermined pattern by development, and removing the wiring layer, which is exposed by removing the resist layer, by etching.

In the above process, a wiring pattern and a via land may be formed with speedy and accurate patterning regardless of deformation of the substrate.

In addition, since it may be not necessary to form exposure masks to be fitted every time when the substrate deforms, the manufacturing cost may be reduced.

DESCRIPTION OF THE PREFERRED EMBODIMENTS

Figure 1:
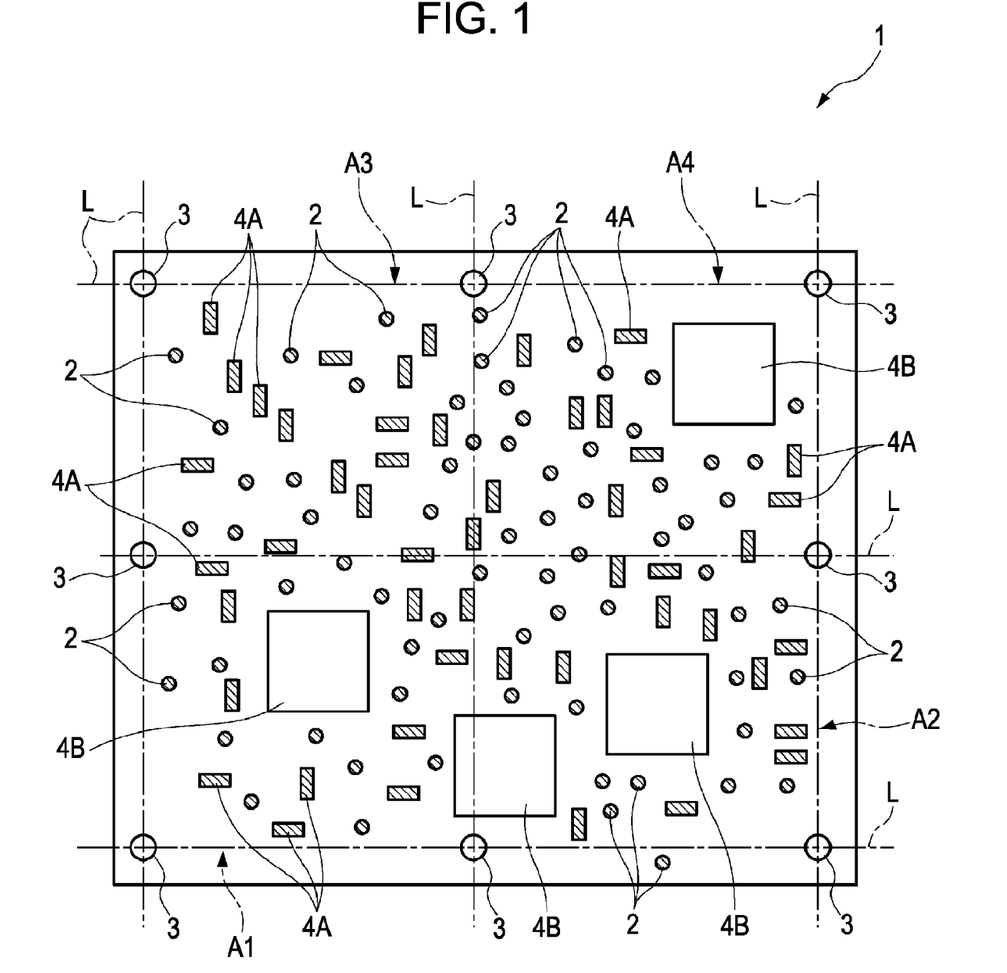
FIG. 1 is a plan view of a printed wiring board manufactured by a manufacturing method of the present invention.
Figure 2:
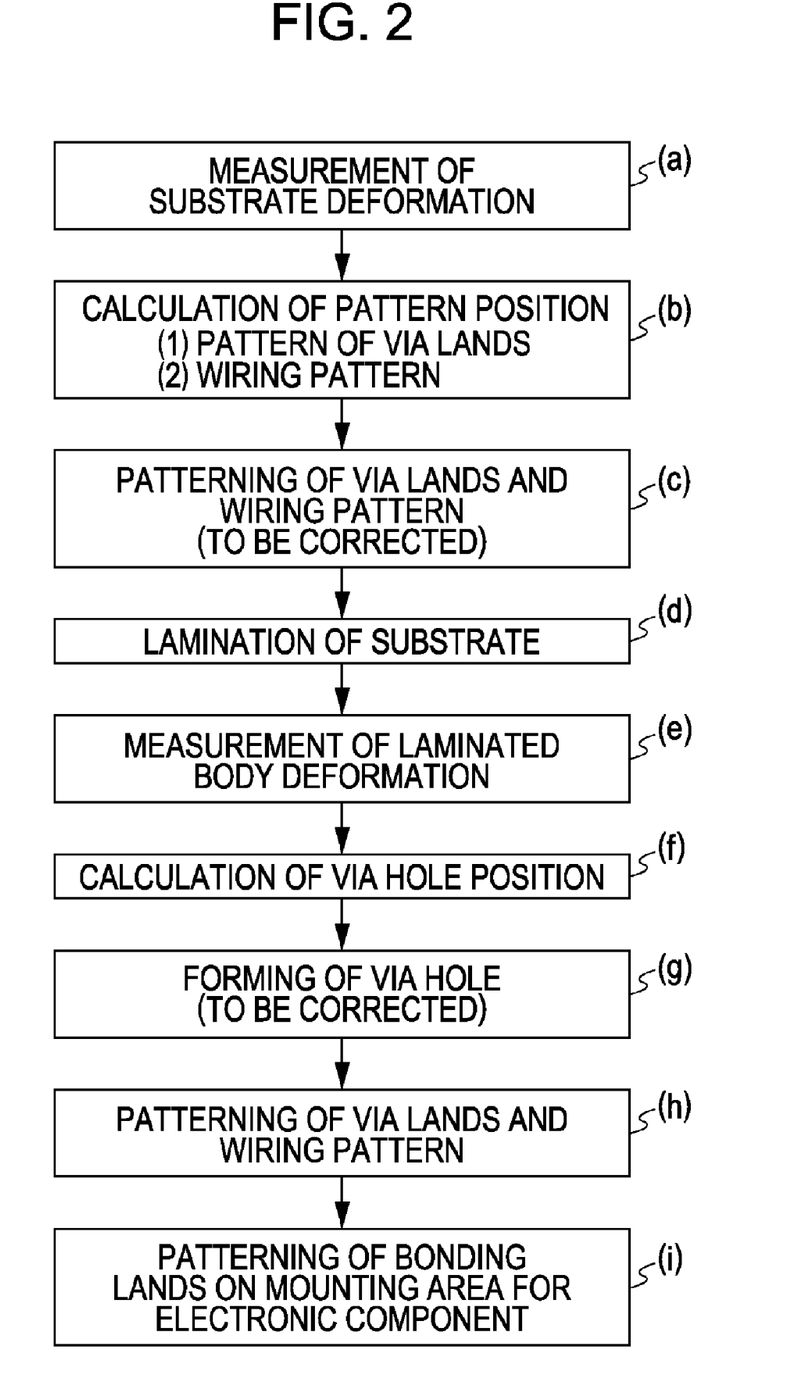
FIG. 2 is a process flow chart of a method for manufacturing a printed circuit board as an embodiment of the present invention.

FIG. 1 is a plan view of a printed wiring board manufactured by a manufacturing method of the present invention, and FIG. 2 is a process flow chart of a method for manufacturing a printed circuit board as an embodiment of the present invention. FIGS. 3A to 3J are cross-section views of the printed wiring board of the present invention in respective manufacturing processes. Note that in FIG. 1, a wiring pattern is omitted, and in FIGS. 3A to 3J, a reference hole (measurement reference) 3 is omitted.

As shown in FIG. 1, a printed wiring board 1 includes many via holes 2 and a plurality of reference holes (measurement references) 3 formed in the peripheral portion of the printed wiring board 1, and there are provided a plurality of electronic parts 4 such as resistors, condensers and other chip parts 4A, LSI chip parts 4B, and the like on the surface of the printed wiring board 1.

First, a method for manufacturing the printed wiring board 1 composed of a single layer will be described with reference to the process flow chart of FIG. 2 and the cross-section views of the printed wiring board of FIGS. 3A to 3F.

Figure 3A:
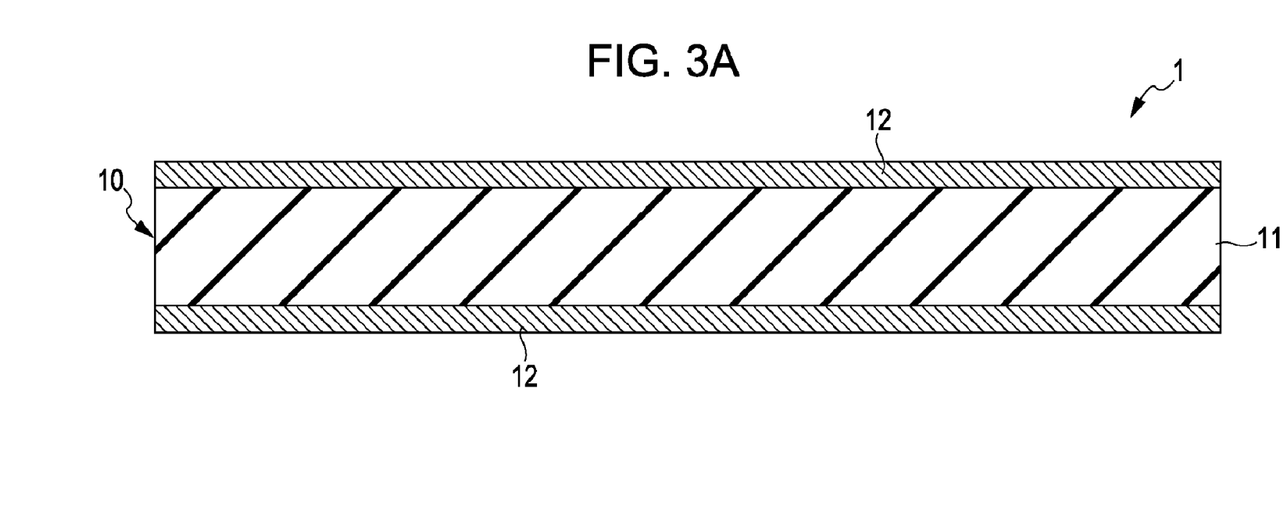
FIG. 3A is a cross-section view of a first substrate, showing a manufacturing process of the printed wiring board of the present invention.

As shown in FIG. 3A, a first substrate 10 is prepared by plating copper foils 12, for example, of the thickness 18 μm on dual sides of a base material 11 composed of an insulative film or the like.

Figure 3B:
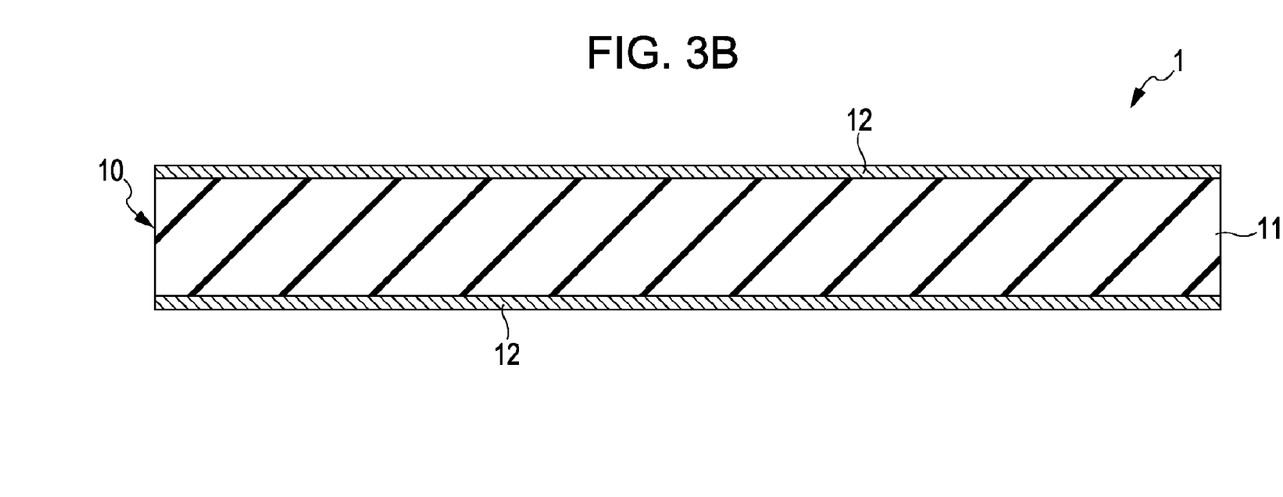
FIG. 3B is a cross-section view of the first substrate, showing a full-surface etching process following that shown in FIG. 3A.

FIG. 3B shows the first substrate 10 in which the thickness of each of the copper foils 12 is reduced in about half, i.e., to the order of 9 μm through a full-surface etching process. In the case when the thickness of each of the copper foils 12 is the order of 9 μm from the first, the above process may be unnecessary.

Figure 3C:
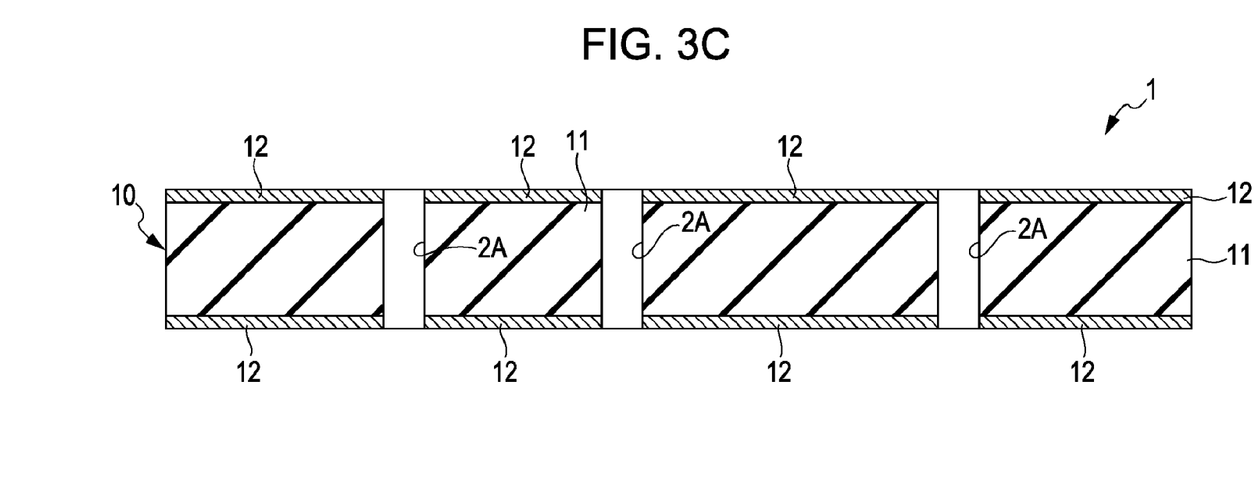
FIG. 3C is a cross-section view of the first substrate, showing a via-hole holing process following that shown in FIG. 3B.

FIG. 3C shows the first substrate 10, at predetermined positions on which a plurality of through holes such as first via holes 2A, reference holes (measurement references) 3 (refer to FIG. 1) and the like are formed with respectively predetermined hole sizes according to predetermined reference data. Incidentally, forming of the above holes may be carried out using a NC machine tool such as a NC drill, NC puncher or the like.

Figure 3D:
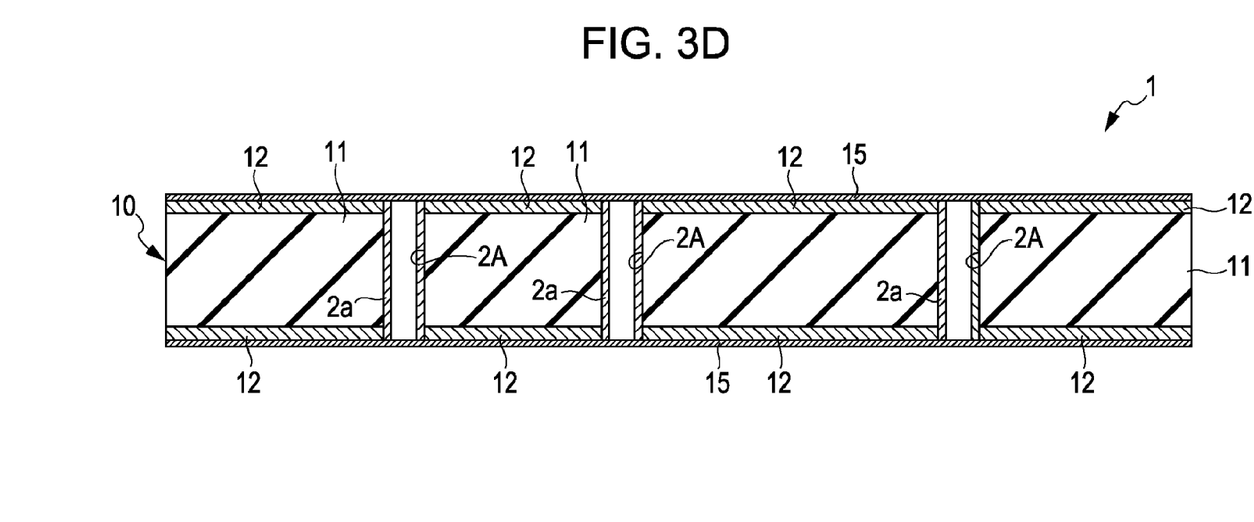
FIG. 3D is a cross-section view of the first substrate, showing a conductive-layer forming process following that shown in FIG. 3C.

FIG. 3D shows the first substrate 10, each of the first via holes 2A of which is provided with a conductive portion 2a through a process for forming conductive layers, and then on each of the both side surfaces (surface of the respective copper foils 12) of which a conductive layer 15 is copper plated by means of an electrolytic plating method.

Figure 3E:
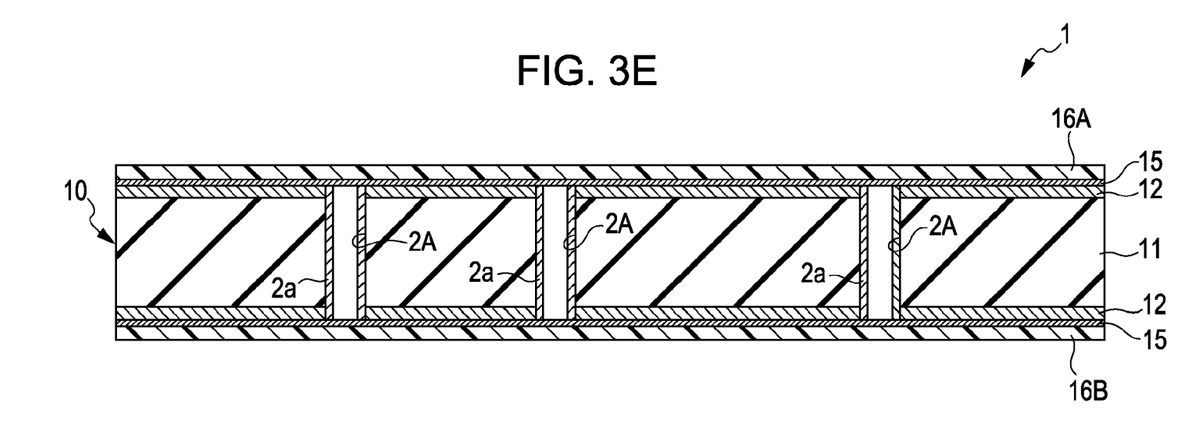
FIG. 3E is a cross-section view of the first substrate, showing a resist-layer forming process following that shown in FIG. 3D.

FIG. 3E shows the first substrate 10, the both side surfaces of which resist layers 16A, 16B are formed, respectively. The portion of each of the resist layers 16A, 16B located on the position of the respective reference holes 3 is then partially removed by, for example, wiping with use of an organic solvent, and only the plurality of reference holes 3 are exposed (not shown).

Here, since the base material 11 composing the first substrate 10 has high water absorbency, it may be subjected to deformation, specifically to a change in its longitudinal and transverse dimensions if it absorbs the organic solvent, water or the like during manufacturing processes. Moreover, it may also be subjected to a change in its longitudinal and transverse dimensions due to heat during manufacturing processes and when the absorbed water or the like is removed by being dried.

For this reason, in the method for manufacturing a printed circuit board of the present invention, deformation measurement of the first substrate 10 is performed as a process (a) (first measurement).

The deformation measurement of the first substrate 10 in the process (a) is able to be performed by use of, for example, an image acquiring device or the like. That is, a plane image of the surface of the first substrate 10 is shot, and from the image data of the plane image, first measurement data are produced by measuring the positions of the reference holes 3 and the first via holes 2A, the distances, angles and the like between the reference holes 3.

Next, as a process (b), comparison of the first measurement data with the designed reference data about the first substrate 10 is executed to calculate the amount of deformation of the first substrate 10 with respect to the reference data. On the basis of the amount of deformation, pattern positions of first wiring patterns 15a and first via lands 15b, and the like to be formed on the first substrate 10 after being deformed are calculated.

In a process (c), the positions of the first via lands 15b corrected on the basis of the calculation results in the process (b) are patterned on the first substrate 10. At the same time, the first wiring patterns 15a are also patterned on both sides of the first substrate 10.

More specifically, in a process (c), an exposure pattern to be used as a reference pattern (reference exposure pattern) is corrected on the basis of the calculation results in the process (b), and exposure to the resist layers 16A, 16B is performed using the corrected exposure patterns. The exposure is able to be performed by use of, for example, a laser imaging apparatus, which exposes a resist layer by directly applying ultraviolet rays thereon with a high imaging speed. In the present invention, the corrected exposure patterns are directly imaged on the resist layers 16A, 16B and exposed thereon.

The resist layers 16A, 16B on both sides of the first substrate 10 are then developed, and as a next step, wet etching is applied to the conductive layers 15.

Figure 3F:
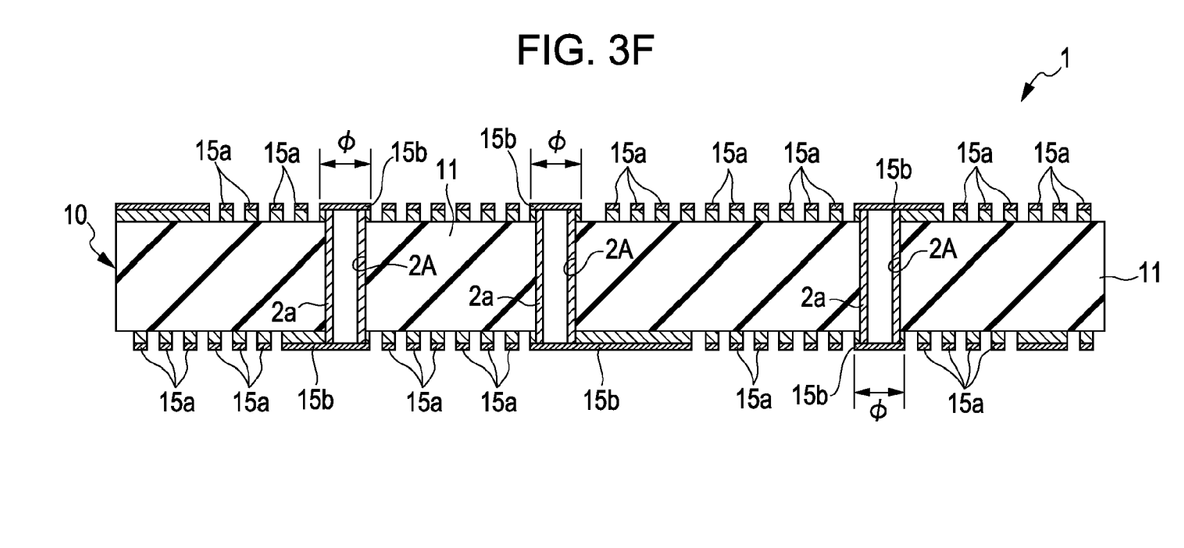
FIG. 3F is a cross-section view of the first substrate, showing a wiring layer forming process following that shown in FIG. 3E.

A wiring layer composed of the first wiring patterns 15a and the first via lands 15b is thus formed on both sides of the first substrate 10 as shown in FIG. 3F.

As described above, the plurality of first wiring patterns 15a are able to be formed in appropriate positions on the first substrate 10 after being deformed, by use of the corrected exposure patterns. At the same time, each of the first via lands 15b is able to be formed in an appropriate size around the opening of each of the first via holes 2A. Each of the first via lands 15b is therefore not formed in an unnecessary big diameter size, which is a point different from known methods. In the case, for example, when the width of each of first wiring patterns 15a is 25 μm, the pitch between adjacent first wiring patterns 15a is 25 μm, and the diameter size of each of the first via holes 2A is 75 μm, the diameter size φ of each of the first via lands 15b is allowed to be the order of 80 μm.

In consequence, the area occupied by the first via lands 15b can be reduced to about one third in comparison with previous methods (about 250 μm), by which it is enabled to utilize the area, where the first via lands 15b occupied, for wiring. It therefore becomes possible to increase the number of the first wiring patterns 15a, i.e., to increase the wiring density, which brings about reduction in the size of the whole of the printed wiring board 1.

Next, a method for manufacturing a multilayer printed circuit board will be described with reference to FIGS. 3G to 3J. In FIGS. 3G to 3J, there is shown a laminated body 1A that is constructed by laminating second substrates 20A, 20B on the both sides of the first substrate 10, respectively.

Figure 3G:
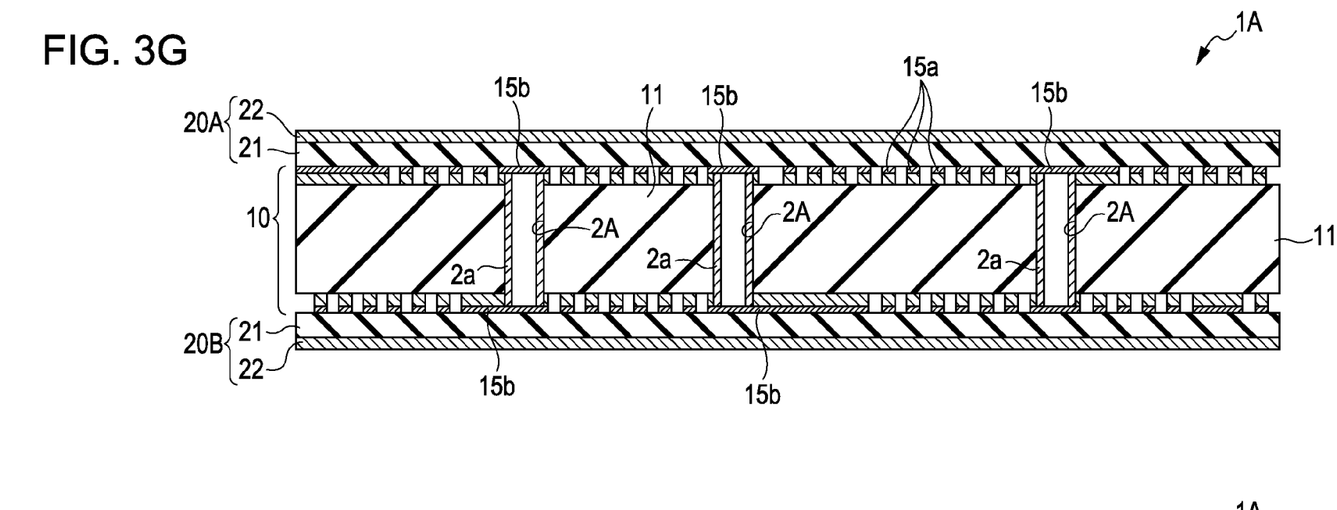
FIG. 3G is a cross-section view of a printed wiring board, showing a state that the first substrate is provided with a second substrate on its both sides in the process following that shown in FIG. 3F.
Figure 3H:
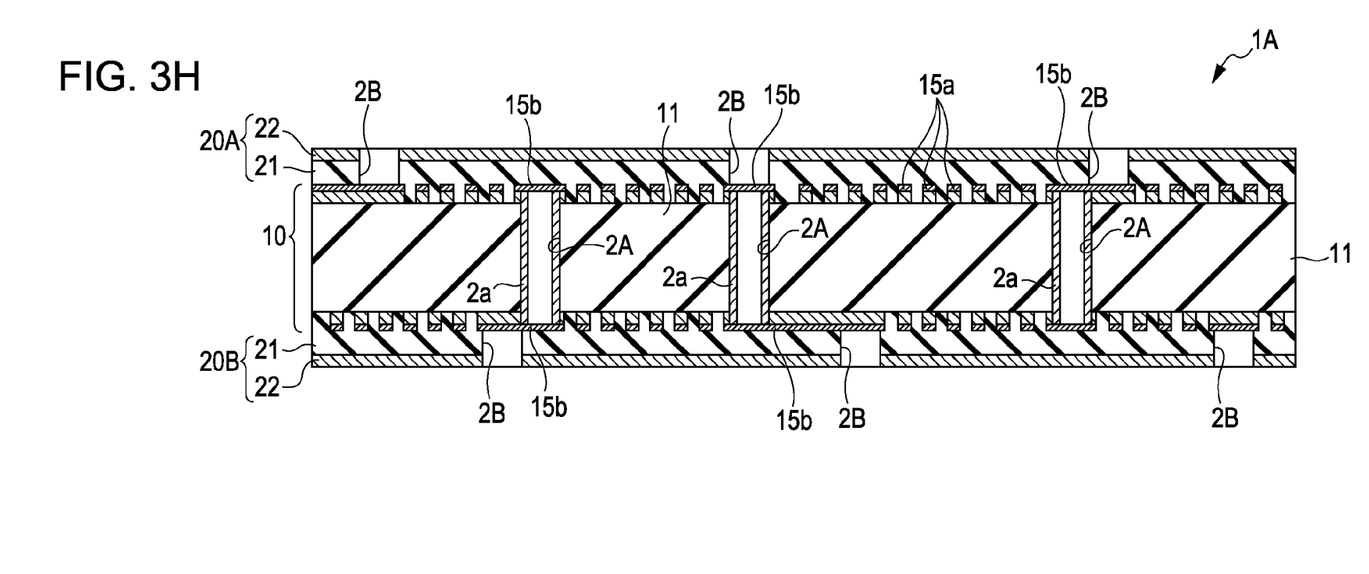
FIG. 3H is a cross-section view of a printed wiring board, showing a process for holing via holes in the second substrate following that shown in FIG. 3G.

As shown in FIG. 3G, in the process (d), the second substrate 20A may be placed on one side face (for example on the top face) of the first substrate 10, which constitutes a primary layer of the multilayer printed circuit board.

The second substrate 20A may be formed by plating a copper foil 22 on one side face of a base material 21 composed of an insulative film, and may be bonded on the first substrate 10. It is noted that the second substrate 20A may be bonded on the other side face of the first substrate 10 in the same manner as aforementioned.

At this time, it is preferable that the reference holes 3 formed in the first substrate 10 are not covered with the second substrate 20A or second substrate 20B.

It is possible to cope with the problem in a manner, for example, such that large-sized holes or cut-away portions, with which the reference holes 3 may be able to be measured even when the first substrate 10 is deformed, are formed in the corresponding portions on the second substrates 20A, 20B. If so arranged, the reference holes 3 formed in the first substrate 10 may be able to be measured from the outside through the large-sized holes or cut-away portions even when the first substrate 10 becomes deformed after the second substrates 20A, 20B are bonded on the both sides thereof.

The second substrates 20A, 20B may be each fixed on the first substrate 10. In the case that the insulative film composing the base material 21 is made of a thermoplastic resin, for example, the resin may be spread over the wiring layer of the first substrate 10 by being fluidized with heat. After this, the resin may be strongly stuck to the both sides of the first substrate 10 after being cooled; thereby, the laminated body 1A may be formed that is composed of the first substrate 10 and the second substrates 20A, 20B each fixed to the both sides of the first substrate 10.

Since, during from the process (a) to the process (d), there are applied a development treatment, an etching treatment, and also a treatment of thermal (heating and cooling) compressive bonding between substrates, the laminated body 1A may be possibly subjected to dimensional deformation in its longitudinal and transverse directions.

Accordingly, in the next process (e), deformation measurement of the laminated body 1A may be performed (second measurement), as with the process (a). The measurement in this process (e) may be performed by measuring the reference holes 3 exposed through the large-sized holes or cut-away portions formed in the second substrates 20A, 20B.

The deformation measurement of the laminated body 1A in the process (e) may be also able to be performed by use of an image acquiring device. That is, a plane image of each of the surfaces of the laminated body 1A (respective surfaces of the second substrates 20A, 20B) is shot, and from the image data of the plane image, second measurement data are produced by measuring the positions of the reference holes 3 and the distances, angles and the like between the reference holes 3.

Next, as a process (f), comparison of the second measurement data with the designed reference data about the respective surfaces of the second substrates 20A, 20B may be executed to calculate the amount of deformation of the second substrates 20A, 20B (the first substrate 10 plus the second substrates 20A, 20B) with respect to the reference data. On the basis of the amount of deformation, positions of second via holes 2B, pattern positions of second wiring patterns 25a, pattern positions of second via lands 25b, and the like to be formed on the laminated body 1A after being deformed may be calculated.

In the case that each of the second substrates 20A, 20B is a top layer (or surface layer) of the laminated body 1A, the electronic parts 4 are mounted on the second substrates 20A, 20B. In this case, in the process (f), the areas where the electronic parts 4 are mounted (mounted areas) may be also calculated at the same time. That is, the positions on the laminated body 1A where the mounted areas of the electronic parts 4 are located may be calculated.

Figure 4A:
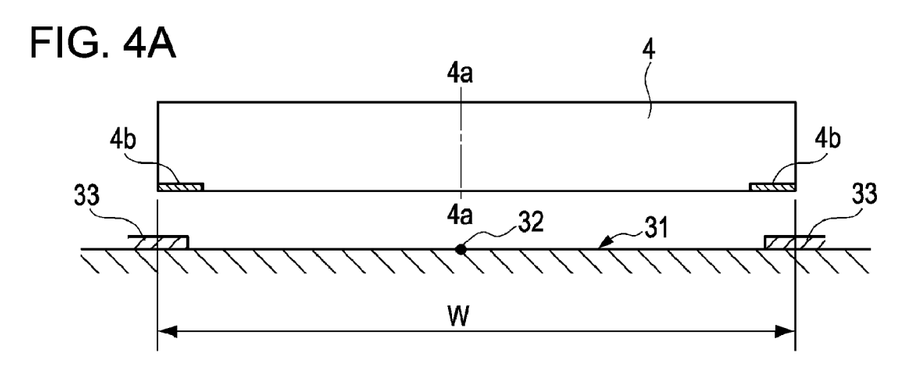
FIG. 4A is a cross-section view showing a mounted area on a printed wiring board.
Figure 4B:
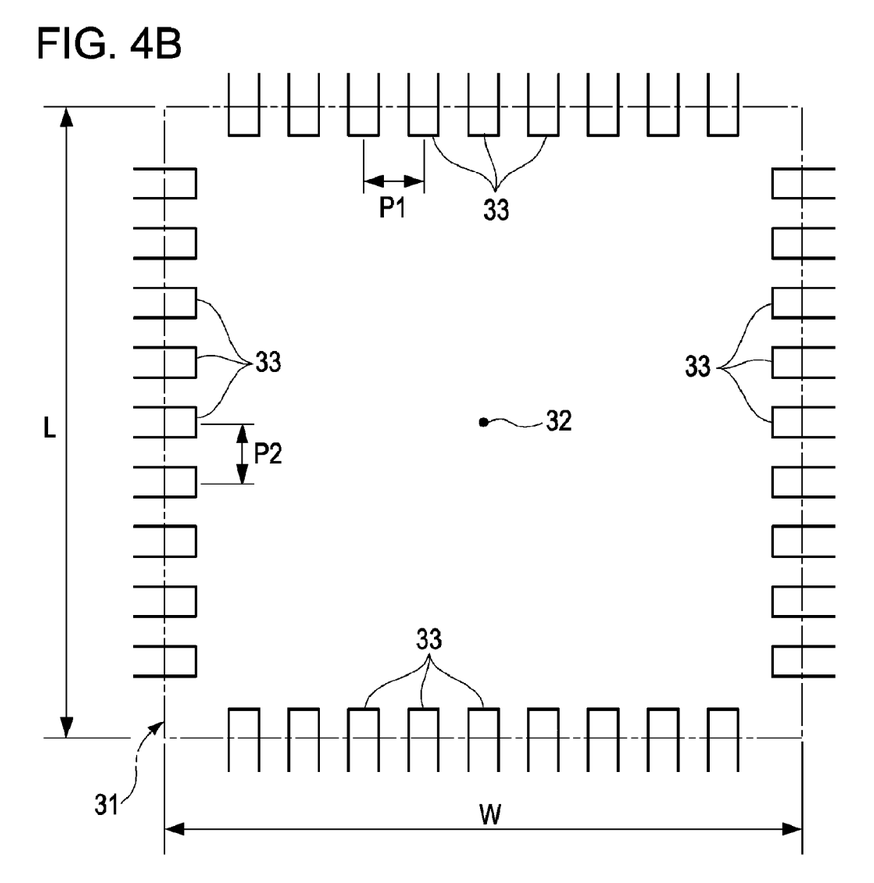
FIG. 4B is a plan view showing the mounted area on the printed wiring board.

For example, as shown in FIG. 4, a mounted area of the electronic parts 4 on a surface of the laminated body 1A is denoted as 31, the base point (center point) of the mounted area 31 is denoted as 32, and a plurality of bonding lands provided in the mounted area 31 is denoted as 33.

As described above, the electronic parts 4 are not subjected to deformation even though the laminated body 1A is deformed. Therefore, the longitudinal dimension L and the transverse dimension W of the mounted area 31 of the electronic parts 4 on a surface of the laminated body 1A have to be kept as specified by the specification of the electronic parts 4 regardless of deformation of the laminated body 1A.

However, the position of the mounted area 31 on the laminated body 1A is needed to be corrected in accordance with the deformation of the laminated body 1A. Namely, the position of the base point 32 is corrected depending on the deformation of the laminated body 1A, but the longitudinal and transverse dimensions L, W of the mounted area 31 with respect to the base point 32 are ensured to be of the predetermined dimensions even after the position of the base point 32 is corrected.

Moreover, pitches P1, P2 between the bonding lands 33 adjoined in longitudinal and transverse directions may be formed in accordance with the predetermined pitches for the respective electronic parts 4 regardless of deformation of the laminated body 1A; thereby, the electronic parts 4 may be able to be mounted on the mounted area 31 after the laminated body 1A is deformed. Furthermore, it may be possible to electrically connect the electrodes 4b of the electronic parts 4 to the bonding lands 33 reliably after being mounted.

Figure 3I:
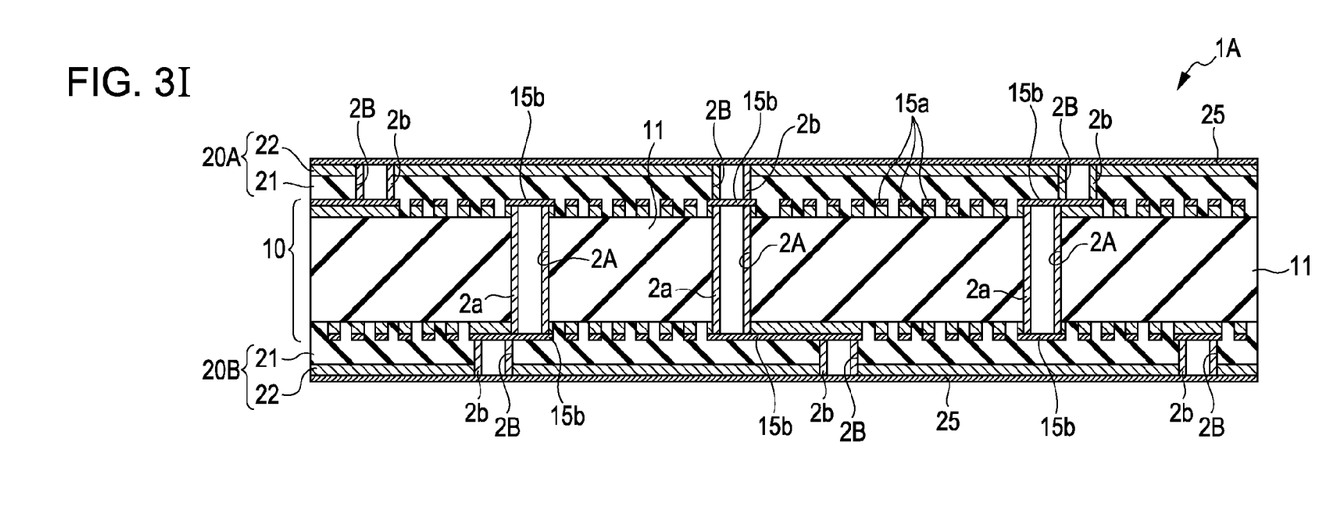
FIG. 3I is a cross-section view of the printed wiring board, showing a wiring layer forming process following that shown in FIG. 3H.

Next, in a process (g), the second via holes 2B may be formed in appropriate positions on the deformed laminated body 1A on the basis of the calculated values described above, as shown in FIG. 3H. FIG. 3I shows the laminated body 1A, each of the second via holes 2B of which is provided with a conductive portion 2b through a process for forming conductive layers, and then on the surface of which a conductive layer 25 is copper plated by means of an electrolytic plating method.

Figure 3J:
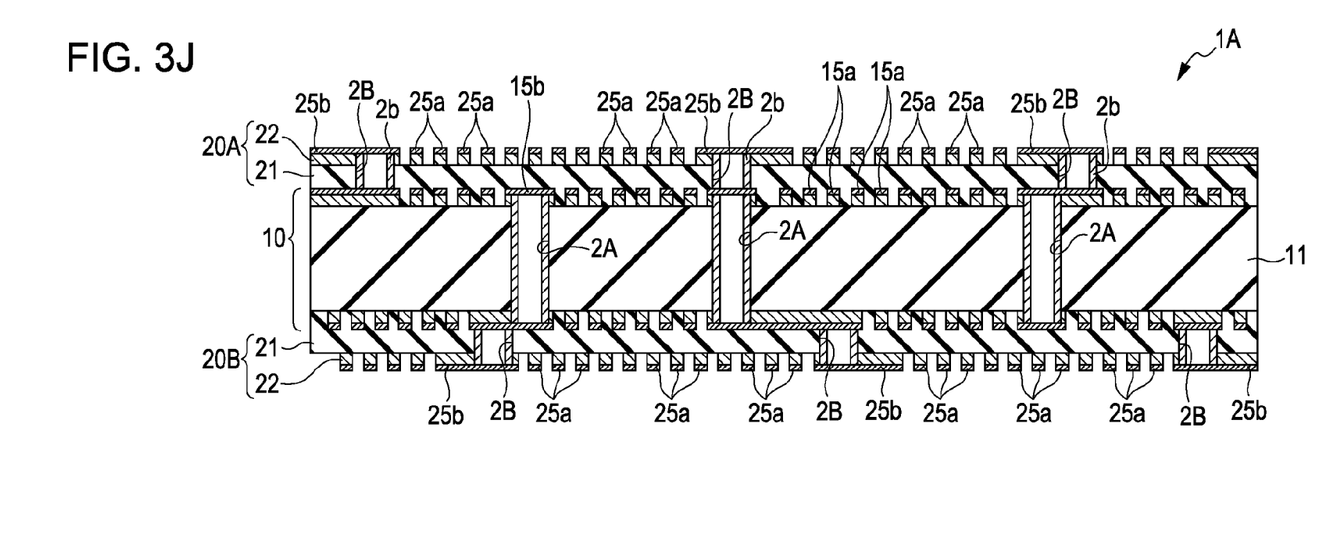
FIG. 3J is a cross-section view of the printed wiring board, showing a process for wiring layer on the surface of the second substrate following that shown in FIG. 3I.

In a next process (h), as shown in FIG. 3J, the second wiring patterns 25a and the positions of the second via lands 25b corrected on the basis of the above calculation results may be patterned on the both surfaces of the laminated body 1A. At this time, wiring arrangement for connecting the second wiring patterns 25a and the second via lands 25b may be done so as to detour the mounted area 31 (refer to FIGS. 4A, 4B).

In a process (i), the plurality of bonding lands 33 (refer to FIGS. 4A, 4B) may be patterned on the mounted area 31 after corrected with the predetermined pitches P1, P2. When the bonding lands 33 may be patterned in the process (i), the bonding lands 33 and the corresponding portion of the second wiring patterns 25a are electrically connected. By this, manufacturing of a printed wiring board of a multi-layer construction is completed (refer to FIG. 3J).

It is noted that the process (i) may be proceeded as a post process of the process (h) as described above, or may be proceeded as a preceding process of the process (h). Alternatively, the process (h) and the process (i) may be proceeded at the same time. In the case that the process (i) is proceeded as the preceding process, i.e., the bonding lands 33 may be first formed and then the second wiring patterns 25a may be formed, the bonding lands 33 may be connected to the corresponding portion of the second wiring patterns 25a when the second wiring patterns 25a are patterned. In the case that the both processes are proceeded at the same time, the bonding lands 33 and the corresponding portion of the second wiring patterns 25a may be connected at the same time.

Patterning at the process (h) and the process (i) may be able to be performed in the same process as aforementioned. That is, there may be formed a resist layer on each of the conductive layers 25 formed on the both surfaces of the laminated body 1A. Then, exposure to the resist layer may be performed using an exposure pattern, which is corrected on the basis of the calculation results in the process (e). The exposure may be able to be performed, in the same manner as aforementioned, by directly applying ultraviolet rays on the resist layer with a high imaging speed using a laser imaging apparatus. After exposed, the resist layer may be developed and then partially removed. Further, wet etching may be applied to the conductive layers 25. The corrected second wiring patterns 25a and the corrected second via lands 25b may be thus patterned on the both side surfaces of the laminated body 1A.

A printed wiring board composed of more multiple layers may be manufactured by applying the above processes (d) to (h) repeatedly to at least one side surface of the laminated body 1A shown in FIG. 3J in the same manner as described above.

It is noted that, in the laminated body 1A, the second wiring patterns 25a and the second via lands 25b, excluding the bonding lands and the like, are needed not to be exposed. Because of this, a solder resist layer is commonly formed on the laminated body 1A.

It is however difficult to apply the solder resist layer so as to cover only the portion, which should not be exposed, excluding the bonding lands and the like. Hence, also in the case of forming a solder resist layer, it becomes possible to expose necessary portions without exposing unnecessary portions on the laminated body 1A by employing the same manner as aforementioned.

Next, the correction method used in aforementioned processes will be described in detail.

The correction of an exposure pattern can be performed by, for example, converting a coordinate system based on reference data to a converted coordinate system based on calculated values.

A conceptual explanation is given as follows by taking FIG. 5A as a designed reference coordinate system D based on reference data and by taking FIG. 5B as a converted coordinate system M after being deformed.

Incidentally, the converted coordinate system M after being deformed is produced on the basis of the calculated values about a plurality of reference holes 3 after being subjected to the process (a) or the process (e).

Further, incidentally, it is preferable that the above coordinate system is composed of small areas, for example, such as small areas A1, A2, A3 and A4 enclosed by imaginary lines L connecting between the reference holes (measurement references) 3 as shown in FIG. 1. In consequence, it becomes possible to obtain a converted coordinate system M that reflects more accurately the first substrate 10 after deformed; thereby, the correction accuracy is improved.

Figure 5A:
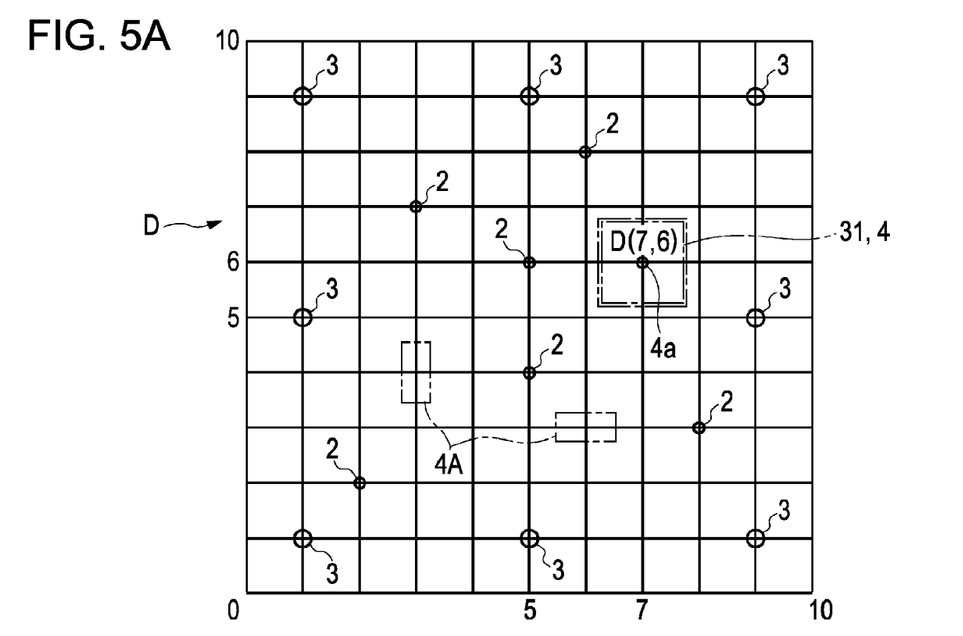
FIG. 5A is an explanatory drawing showing a designed reference coordinate system D based on reference data, given for conceptually explaining a correction method.
Figure 5B:
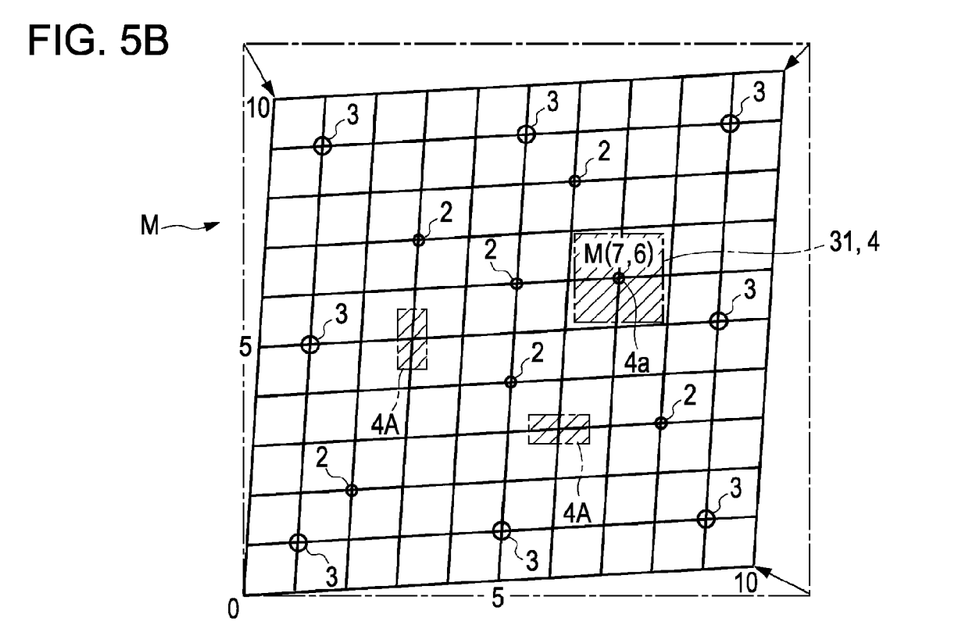
FIG. 5B is an explanatory drawing showing a converted coordinate system M after being deformed, given for conceptually explaining a correction method.

The base point 4a of an electronic part 4 is corrected, for example, from a position D (7, 6) in the reference coordinate system D shown in FIG. 5A to a position M (7, 6) in the converted coordinate system M after being deformed shown in FIG. 5B. Then, the mounted area of the electronic part 4 is ensured to have the same dimensions as being deformed with having the base point 4a on the converted coordinate system M at the center.

Incidentally, the positions of the plurality of second via holes 2B, the second wiring patterns 25a, the second via holes 25b, and the like are also converted onto the converted coordinate system M in the same manner as described above.

As described above, electronic parts, via holes, via lands, wiring patterns, and the like may be able to be rearranged at appropriate positions on a substrate after being deformed by using the converted coordinate system M.

In the above embodiment, the first via holes 2A and the reference holes 3 may be formed after the first substrate 10 is subjected to a full-surface etching process, and after that a conductive portion 2a may be formed on the inner wall of each of the first via holes 2A through a process for forming conductive layers, but the present invention is not limited to this.

Figure 6A:
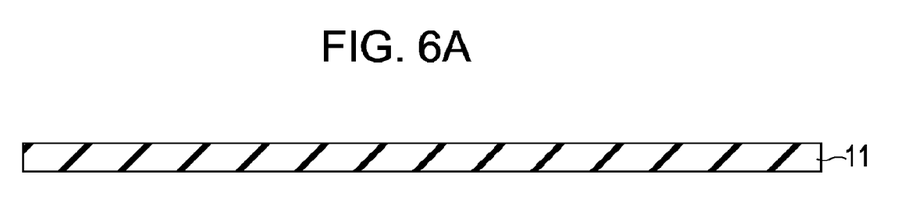
FIG. 6A is a cross-section view of a first substrate, showing a manufacturing process of the printed wiring board of another embodiment.
Figure 6B:
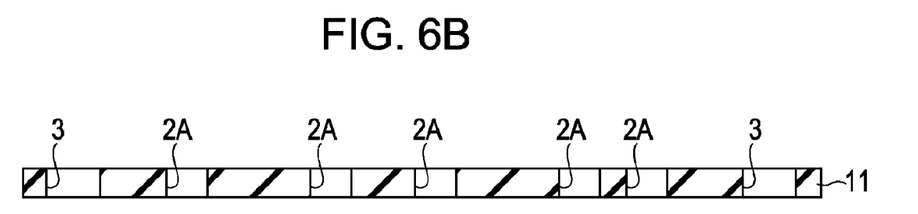
FIG. 6B is a cross-section view of the first substrate, showing a holing process of via holes and reference holes following that shown in FIG. 6A.
Figure 6C:
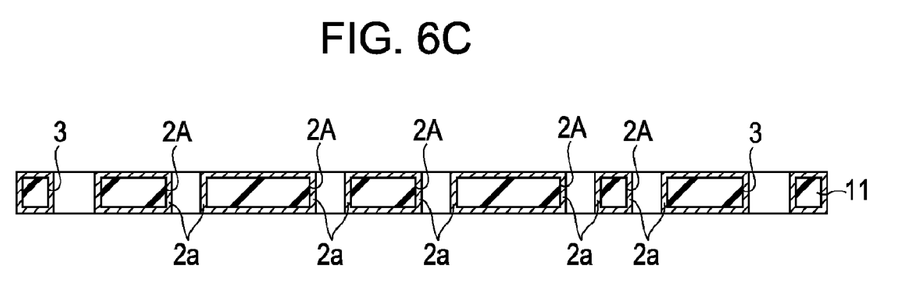
FIG. 6C is a cross-section view of the first substrate, showing processes for forming a conductive portion on the inner wall of the first via hole and for forming a conductive layer on the surface of the first substrate following that shown in FIG. 6B.

As shown in FIGS. 6A to 6C, for example, first via holes 2A and reference holes 3 may be first formed in a first substrate 10 using a laser drill or the like, and then a conductive portion 2a may be formed on the inner wall of each of the first via holes 2A and a conductive layer may also be formed on the both side surfaces of the first substrate 10 by means of an electroless plating method.

In addition, although the case is described, in the above embodiment, that the reference holes 3 formed in a substrate are used as the measurement reference as an example, the present invention is not limited to this, and, for example, a cross mark printed on the substrate or other measurement references may be used. Alternatively, the measurement reference is not necessary to be a constructive one, but may be of a portion of the substrate itself such as the four corners (edges) of the first substrate 10.

What is claimed is:

1. A method for manufacturing a printed circuit board including:
    a single-layer or multilayer substrate having a surface provided with a mounting area for installing an electronic part thereon;
    a plurality of bonding lands positioned in the mounting area for fixing electrodes of the electronic part, and
    a wiring pattern connected to the bonding lands,
the method comprising steps of:
    (o) measuring deformation of the substrate;
    (p) calculating a position for the mounting area to be allocated based on the deformation measured in the step (o); and
    (q) patterning the bonding lands and the wiring pattern by correcting an originally allocated position of the mounting area based on the calculated position in the step (p), so that the bonding lands has a predetermined pitch according to dimensions of the electronic part regardless of the deformation of the substrate.

2. The method for manufacturing a printed circuit board according to claim 1,
    wherein the substrate has a via hole therein, the method further comprising:
        calculating in the step (p) a position for a via land to be patterned based on the deformation measured in the step (o);
        forming the via land around an opening of the via hole on the surface of the substrate by correcting an originally designed position thereof based on the calculated position in the step (p).

3. The method for manufacturing a printed circuit board according to claim 1,
    wherein the patterning in step (q) comprises:
        forming a resist layer for covering a conductive layer on the surface of the substrate;
        exposing the resist layer by applying light thereon so as to draw a predetermined pattern;
        removing part of the resist layer and leaving a predetermined pattern by development; and
        patterning the conductive layer by removing part of the conductive layer exposed through the predetermined pattern of the resist layer, by etching.

4. The method for manufacturing a printed circuit board according to claim 1, wherein the substrate includes a plurality of measuring references located at predetermined positions in a designed coordinate system for the substrate, and in the step (o), the deformation of the substrate is measured by detecting the positions of the plurality of measuring references, the step (p) including:
    comparing detected positions of the measuring references with the predetermined positions of the measuring references to obtain deformation data; and
    converting the designed coordinate system into a corrected coordinate system based on the deformation data.

5. A method for manufacturing a printed circuit board including a first substrate formed of an insulation material, a first wiring pattern formed on a surface of the first substrate, a second substrate formed of an insulation material overlaid on at least one surface of the first substrate, a second wiring pattern formed on a surface of the second substrate, and a via hole formed in the second substrate to provide an electrical connection between the first wiring pattern and the second wiring pattern, the method comprising steps of:
   (j) measuring deformation of a laminated body composed of the first substrate and the second substrate;
   (k) calculating a position for the via hole to be formed in the second substrate based on the deformation of the laminated body measured in the step (j);
   (l) forming the via hole by correcting an originally designed position thereof in the second substrate based on the calculated position in the step (k); and
   (m) forming a via land around an opening of the via hole on the surface of the second substrate before or after the step (l),
   wherein the step (m) includes calculating a position for the via land to be patterned based on the deformation measured in the step (j), the via land being patterned by correcting an originally designed position thereof by the calculated position.

6. The method for manufacturing a printed circuit board according to claim 5, further comprising a step of:
   (n) forming a plurality of bonding lands in a mounting area for mounting an electronic part on the surface of the second substrate, before, after, or during the step (l), the plurality of bonding lands being electrically connected to the second wiring pattern, electrodes of the electronic part being fixed to the plurality of bonding lands,
   wherein in the step (n), the plurality of bonding lands are patterned to have a predetermined pitch in accordance with dimensions of the electronic part regardless of the deformation of the laminated body.

7. The method for manufacturing a printed circuit board according to claim 6, further comprising:
   calculating a position for the mounting area to be allocated based on the deformation of the laminated body measured in the step (j), and
   wherein in the step (n), an originally designed the position of the mounting area is corrected based on the calculated position such that the plurality of bonding lands are patterned with the predetermined pitch regardless of the deformation of the laminated body.

8. The method for manufacturing a printed circuit board according to claim 5,
   wherein the forming in step (m) comprises:
      forming a resist layer for covering a conductive layer on the surface of the second substrate;
      exposing the resist layer by applying light thereon so as to draw a predetermined pattern;
      removing part of the resist layer and leaving a predetermined pattern by development; and
      patterning the conductive layer by removing part of the conductive layer exposed through the predetermined pattern of the resist layer, by etching.

9. The method for manufacturing a printed circuit board according to claim 5, wherein the laminated body includes a plurality of measuring references located at predetermined positions in a designed coordinate system for the laminated body, and in the step (j), the deformation of the laminated body is measured by detecting the positions of the plurality of measuring references, the step (k) including:
   comparing detected positions of the measuring references with the predetermined positions of the measuring references to obtain deformation data; and
   converting the designed coordinate system into a corrected coordinate system based on the deformation data.

10. A method for manufacturing a printed circuit board including a first substrate formed of an insulation material, a first via hole formed in the first substrate, and a first via land formed on a surface of the first substrate around an opening of the first via hole, the method comprising steps of:
   (a) measuring deformation of the first substrate having the first via hole formed therein;
   (b) calculating a position for the first via land to be patterned based on the deformation of the first substrate measured in the step (a);
   (c) patterning the first via land on the surface of the first substrate by correcting an originally designed position thereof based on the calculated position in the step (b);
   (d) forming a laminated body by overlaying a second substrate formed of an insulation material on at least one surface of the first substrate;
   (e) measuring deformation of the laminated body;
   (f) calculating a position for a second via hole to be formed based on the deformation of the laminated body measured in the step (e);
   (g) forming the second via hole in the second substrate by correcting an originally designed position based on the calculated position in the step (f);
   (h) forming on a surface of the second substrate a second via land around an opening of the second via hole, and a second wiring pattern; and
   (i) forming a plurality of bonding lands on the surface of the second substrate in a mounting area for mounting an electronic part, before, after, or during the step (h), the plurality of bonding lands being electrically connected to the second wiring pattern, and electrodes of the electronic part being fixed to the plurality of bonding lands,
   wherein in the step (i), the plurality of bonding lands are arranged to have a predetermined pitch in accordance with dimensions of the electronic part regardless of the deformation of the laminated body.

11. The method for manufacturing a printed circuit board according to claim 10,
   wherein the step (b) further calculates a position for a first wiring pattern to be formed on the surface of the first substrate at the same time as calculating the position for the first via land, and in the step (c), both of the first via land and the first wiring pattern are patterned by correcting respective originally designed positions based on the calculated positions in the step (b).

12. The method for manufacturing a printed circuit board according to claim 10,
   wherein a plurality of measuring references are provided on the first substrate, and in the step (a), the deformation of the first substrate is measured by detecting the positions of the plurality of measuring references.

13. The method for manufacturing a printed circuit board according to claim 10,
   wherein the measurement of the deformation of the first substrate in the step (a) and the measurement of the deformation of the laminated body in the step (e) are both performed on the basis of common measurement references reference provided in the first substrate.

14. The method for manufacturing a printed circuit board according to claim 10,
   wherein the step (h) includes calculating a position for the second via land to be patterned based on the deformation measured in the step (e), and the second via land is patterned by correcting an originally designed position thereof based on the calculated position.

15. The method for manufacturing a printed circuit board according to claim 10, further comprising:
    calculating a position for the mounting area to be allocated based on the deformation of the laminated body measured in the step (e),
    wherein in the step (i), an originally designed position of the mounting area is corrected based on the calculated position such that the plurality of bonding lands are patterned with the predetermined pitch regardless of the deformation of the laminated body.

16. The method for manufacturing a printed circuit board according to claim 10,
    wherein the patterning in the step (c) comprising steps of:
        forming a resist layer for covering a conductive layer on the surface of the first substrate;
        exposing the resist layer by applying light thereon so as to draw a predetermined pattern;
        removing part of the resist layer and leaving a predetermined pattern by development; and
        patterning the conductive layer by removing part of the conductive layer exposed through the predetermined pattern of the resist layer, by etching.

17. The method for manufacturing a printed circuit board according to claim 12, wherein the plurality of measuring references have predetermined positions in a designed coordinate system for the first substrates, the steps (b) and (f) each including:
    comparing detected positions of the measuring references with the predetermined positions of the measuring references to obtain deformation data; and
    converting the designed coordinate system into a corrected coordinate system based on the deformation data.

* * * * *